US010511291B1

United States Patent
Kandah et al.

(10) Patent No.: US 10,511,291 B1
(45) Date of Patent: Dec. 17, 2019

(54) TRANSMITTING WATCHDOG AND PRECISION MEASUREMENTS ACROSS A GALVANIC ISOLATION BARRIER IN THE PRESENCE OF LARGE PERIODIC NOISE PULSES

(71) Applicant: NXP USA, Inc., Austin, TX (US)

(72) Inventors: Ibrahim S. Kandah, Novi, MI (US); Fred T. Brauchler, Canton, MI (US); Kim R. Gauen, Noblesville, IN (US); David D. Putti, Novi, MI (US); Vasily A. Syngaevskiy, Moscow (RU)

(73) Assignee: NXP USA, Inc., Austin, TX (US)

( * ) Notice: Subject to any disclaimer, the term of this patent is extended or adjusted under 35 U.S.C. 154(b) by 0 days.

(21) Appl. No.: 16/224,109

(22) Filed: Dec. 18, 2018

(51) Int. Cl.
*H03K 3/013* (2006.01)
*H03K 17/567* (2006.01)
*H03K 3/017* (2006.01)

(52) U.S. Cl.
CPC ............. *H03K 3/013* (2013.01); *H03K 3/017* (2013.01); *H03K 17/567* (2013.01)

(58) Field of Classification Search
CPC ....... H03K 3/013; H03K 3/017; H03K 17/567
USPC .... 327/108–112, 427, 434, 437; 326/82, 83, 326/87
See application file for complete search history.

(56) References Cited

U.S. PATENT DOCUMENTS

| 9,673,809 | B1 * | 6/2017 | Kandah | ................ H03K 17/691 |
| 2009/0243764 | A1 | 10/2009 | Hauenstein | |
| 2012/0188796 | A1 * | 7/2012 | Randall | ................... H02M 1/32 |
| | | | | 363/21.01 |
| 2017/0077805 | A1 | 3/2017 | Sicard et al. | |

OTHER PUBLICATIONS

NXP Semiconductors, MC33GD3100 Advanced IGBT Gate Driver, Draft Data Sheet: product review, Rev. 1.6, 2017.
STMICORELECTRONICS, STGAP1S gapDRIVE: galvanically isolated single gate driver Datasheet preliminary data, DocID027190, Rev. 1, Nov. 2014.

* cited by examiner

*Primary Examiner* — Tomi Skibinski

(57) ABSTRACT

A control system (100, 200) and method (300) are provided where a first voltage domain circuit (111) and a power switch (121) operate in a first voltage domain and where a second voltage domain circuit (109) operates in a second voltage domain, where the second voltage domain circuit includes a gate driver circuit (202) for providing a control terminal driving signal (PWM1) to drive the power switch, and also includes a watchdog communication circuit (207) for scheduling watchdog communications between the first and second voltage domain circuits to be temporally separated from noise-inducing signal transitions in the control terminal driving signal.

20 Claims, 6 Drawing Sheets

TRANSMITTING WATCHDOG AND PRECISION MEASUREMENTS ACROSS A GALVANIC ISOLATION BARRIER IN THE PRESENCE OF LARGE PERIODIC NOISE PULSES

BACKGROUND OF THE INVENTION

Field of the Invention

The present invention is directed in general to the field of power switch driver circuits. In one aspect, the present invention relates to an apparatus, system and method for driving high voltage circuits from low voltage circuits.

Description of the Related Art

With increasing demand for microcontroller applications which provide high voltages and/or currents for applications, such as automotive applications, there are integrated circuit technologies which use high voltage transistors, such as an insulated gate bipolar transistors (IGBT), in voltage domains that have a significantly higher supply voltage than the digital control circuitry that is used to control the operation of the high voltage transistor. For example, in the automotive sector, there are increasingly electrification functions which require high current supplies, such as E-motor drives in hybrid car applications, starter-generator applications, high power DC/DC converters, and electric power steering or electric braking applications. In such applications, the voltage of a gate drive signal supplied to a high voltage IGBT may swing from 0 volts to 100s of volts, while the voltage of the digital control circuitry for the IGBT operates at a relatively lower voltage (e.g. 3.3 volts, 5 volts). As will be appreciated, significant noise events generated in the high voltage domain can interfere with control signaling in the low-voltage domain. For example, the operation of a three-phase motor will generate large noise events at the fundamental PWM frequency of the motor rotors since current is switched in each phase at very fast rates, generating radiated noise and conducted noise on the supply and signal lines of the devices which drive the inverter power stage.

Conventional solutions for controlling noise effects use integrated galvanic isolation barriers to isolate the PWM signals in the microprocessor in the low voltage domain from the power switches which operate in the high voltage domain. However, galvanic isolation barriers do not provide sufficient protection against noise, and this can be problematic with safety critical applications, such as automotive systems, where it is important to accurately monitor the environment in which the high voltage power switches operate. In such applications, fast current switching in the high voltage domain circuitry can generate radiated noise that is conducted on the supply and signal lines of the low voltage domain circuitry which drive and monitor the high voltage domain circuitry. For example, a microcontroller that is connected to monitor a power switch die temperature with a regular schedule of watchdog commands can have the watchdog commands and/or temperature measurements corrupted by noise from the power switch die, resulting in a false over temperature shutdown event. As seen from the foregoing, the existing solutions for controlling and operating power transistors with control circuitry in the low voltage domain that is robust against noise from the high voltage domain are extremely difficult at a practical level by virtue of the challenges with meeting the size and performance requirements for high voltage applications while also providing noise immunity against high voltage signal switching events from the power transistors.

BRIEF DESCRIPTION OF THE DRAWINGS

The present invention may be understood, and its numerous objects, features and advantages obtained, when the following detailed description of a preferred embodiment is considered in conjunction with the following drawings.

DETAILED DESCRIPTION

Figure 1:
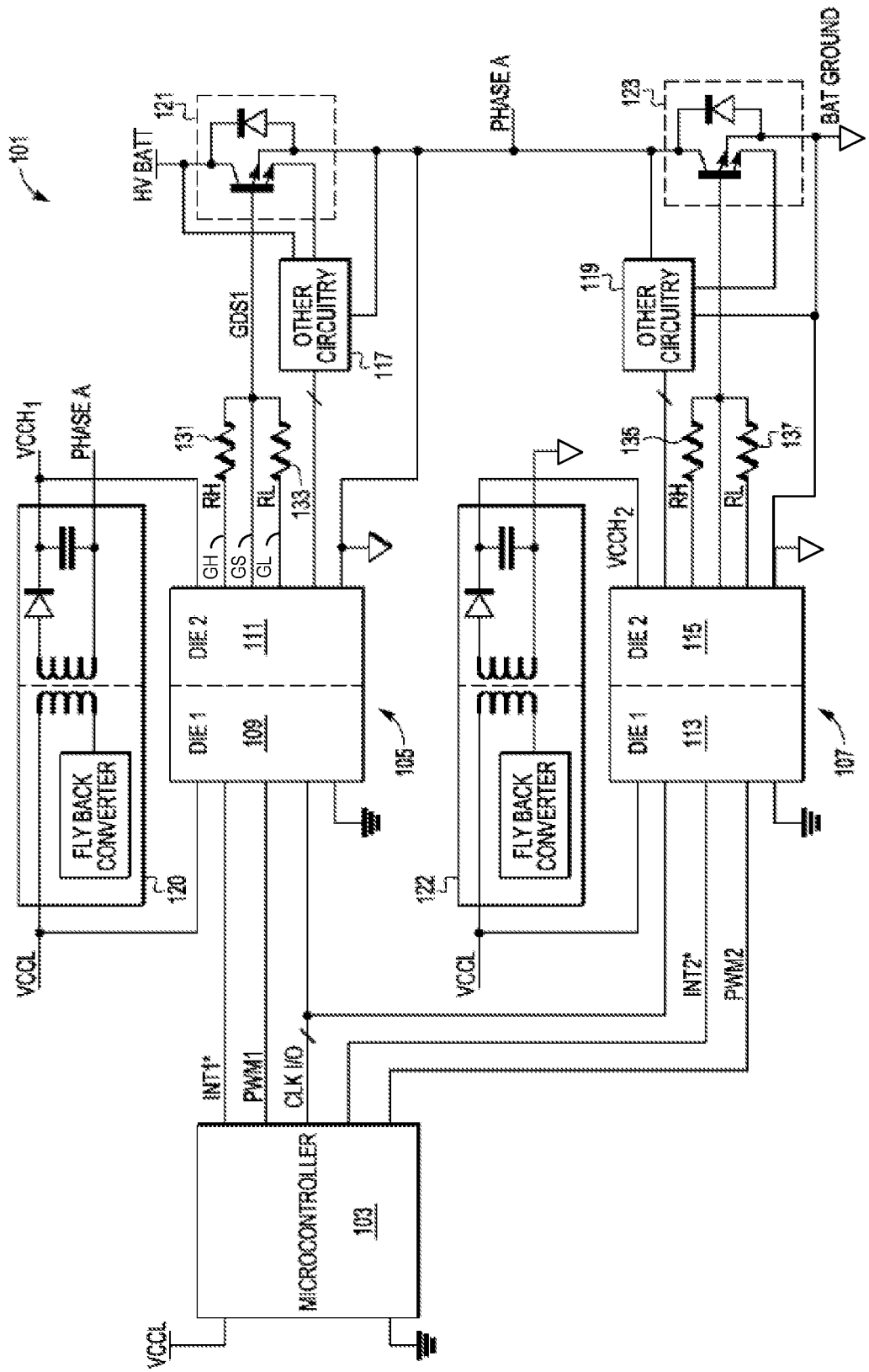
FIG. 1 depicts a circuit diagram of a portion of a control system for a high voltage system that uses power transistor in accordance with selected embodiments of the present disclosure.

An apparatus, system, architecture, methodology, and program code are described for controlling the transmission timing of watchdog and precision measurements across a galvanic isolation barrier to avoid large periodic noise-inducing high voltage circuit operations. In selected embodiments where a gate driver device controls the power switches in a high voltage motor with pulse width modulated (PWM) gate control signals, the gate driver device uses the duty cycle and frequency of the PWM gate control signal to schedule the die-to-die transmissions of watchdog commands so that data operation requests, data operations, and data operation responses avoid noise-induced corruption that coincides with transitions in the PWM gate control signal provided from the low voltage domain circuit across a galvanic isolation barrier to the high voltage domain circuit. In this way, the gate driver device may be configured to manage the operations of the high and low voltage sides to avoid communications between when large noise is present and able to corrupt a data frame and/or data operation like an ADC conversion. In selected example embodiments, a system control circuit includes a low voltage domain circuit that generates a pulse signal to control a terminal drive signal in a high voltage domain circuit. Using watchdog control logic and/or circuitry in the low voltage domain circuit and/or high voltage domain circuit, the frequency and duty cycle of the PWM gate control signal are used to schedule a watchdog request that is also sent from the low voltage domain circuit across the galvanic isolation barrier to the high voltage domain circuit using a first specified delay to avoid interference from noise generated by the high voltage domain circuit in response to transitions in the PWM gate control signal. In response to the watchdog request, the high voltage domain circuit performs a data operation that is also scheduled to avoid interference from noise generated by the high voltage domain circuit in response to transitions in the PWM gate control signal. Depending on the duty cycle and frequency of the PWM gate control signal, watchdog control logic and/or circuitry in the high voltage domain circuit schedules a watchdog response to be sent from the high voltage domain circuit across the galvanic isolation barrier to the low voltage domain circuit using a second specified delay to avoid interference from noise generated by the high voltage domain circuit in response to transitions in the PWM gate control signal. As will be appreciated, the watchdog request and watchdog response may be scheduled to occur during the same PWM pulse if permitted by the pulse width duration or duty cycle, or may be scheduled to occur during multiple PWM pulses if a single pulse width duration or duty cycle is not sufficient. In other embodiments, a minimum and/or maximum wait time between scheduled watchdog commands may be used to ensure that watchdog operations provide sufficient watchdog functionality (in terms of providing a baseline watchdog feedback) without consuming excessive processing resources (by processing watchdog feedback too frequently).

To provide additional details for an improved contextual understanding of the present disclosure, reference is now made to FIG. 1 which depicts a circuit diagram of a portion of a control system 101 for a high voltage system that uses power transistor (e.g., 121, 123) in accordance with selected embodiments of the present disclosure. For example, the system 101 may be embodied as a variable speed motor controller that controls the operation of a multi-phase electric motor (not shown) by controlling the duty cycle or "on time" of the pulses provided to the gates of the IGBTs 121, 123 connected to the phase windings (e.g. "Phase A" terminal) of the motor. In selected embodiments, the "on times" of the IGBTs are controlled to approximate sinusoidal signals provided to the motor windings. To this end, the microcontroller 103 may be configured to provide a pulse width modulated signal PWM1 to driver module 105 and pulse width modulated signal PWM2 to driver module 107 at a frequency and duty cycles to turn the IGBTs 121 and 123 ON and OFF. The gates of IGBTs 121 and 123 are controlled by driver modules 105 and 107, respectively.

Each driver module 105 and 107 may be implemented as an integrated circuit package that includes a low voltage die (109, 113) and a high voltage die (111, 115). Low voltage die (109, 113) includes circuitry that operates in the low voltage domain of VCCL (e.g. +3.3 VDC), which in the embodiment shown, is the same voltage domain as that of microcontroller 103. The high voltage die (111, 115) includes circuitry that operates in a higher voltage domain (e.g. 15 VDC) and interfaces to the external power switch which operates at HVBATT level (e.g., 400V). In the embodiment shown, high voltage die 111 and 115 are each supplied from a voltage regulator 120 and 122, respectively, that are supplied from the power supply of the low voltage domain (VCCL). In addition, the low voltage output terminal of regulator 120 is connected to the Phase A winding terminal (Phase A) such that the supply voltage provided to die 111 is at a particular voltage (e.g. 15 volts) above the voltage of the phase A winding terminal. The high voltage die operates at a voltage above the phase A winding so that the voltage provided to the gate of IGBT 121 will always be above the Phase A winding terminal. However, in other embodiments, die 111 may be supplied by the voltage of the battery supply (HV BATT). The low voltage output terminal of regulator 122 is tied to ground such that die 115 is supplied at 15 volts. In one embodiment, the ground of regulator 122 and die 115 are connected and isolated from the ground of microcontroller 103 and die 113. In one embodiment, the HV BATT is at 400 VDC.

Though not shown, it will be appreciated that driver modules 105 and 107 each include signal lines with galvanic isolation barriers for exchanging signals between the low voltage die (Die 1) and the high voltage die (Die 2). In selected embodiments, the low voltage die and the high voltage die are positioned within the integrated circuit package to enable operation of the galvanic isolation barrier signal paths. In some embodiments, the dice are stacked on top of each other in the integrated circuit package. In other embodiments, the dice are located side by side in an integrated circuit package. In still other embodiments, the dice may be located offset from each other. In still other embodiments, the dice may be located in different integrated circuit packages.

The depicted microcontroller 103 is connected to receive interrupt signals (Int1* and Int2*) that are asserted low when a low voltage die (109, 113), respectively, wants to generate an interrupt. In selected embodiments, the interrupt signals from the driver modules 105, 107 may be tied to one interrupt pin of microcontroller 103. In addition, other signals may be exchanged between microcontroller 103 and the low voltage die 109 and 113 of driver modules 105 and 107, such as clocking and I/O signals.

In operation, the power transistor 121, when conductive, provides current from a battery source (not shown) to the phase A motor windings. Similarly, the power transistor 123, when conductive, sinks current to the battery ground from the phase A motor windings. As will be appreciated, the IGBTs 121 and 123 are not necessarily conductive at the same time. In some embodiments, the pulses of PWM1 and PWM2 are at a high state at opposite times. In other embodiments, there may be dead times between the ON times of the two IGBTs 121, 123 to avoid connecting the high voltage battery terminal (HV BATT) to ground (BAT GROUND).

The depicted system 101 also includes resistors 131, 133, 135, and 137 that are connected as shown to the gates of the IGBTs 121 and 123 to reduce the rate of transition of the gate driver voltage from a high voltage to a low voltage and vice versa. This reduction in the rate of transition helps reduce the noise associated with a relatively fast switching signal.

System 101 may also include other circuitry 117 and 119 which are coupled to the terminals of IGBTs 121 and 123 respectively and terminals of modules 105 and 107, respectively. In various embodiments, the other circuitry 117 and 119 includes resistors, capacitors, and diodes for providing regulated voltages at the terminals. In some embodiments, other circuitry 117 and 119 may be used to detect short circuits, either by sensing the emitter of an IGBT sense leg (if the IGBT includes it), or by sensing the collector voltage of the IGBT, or circuitry to sense the power switch die temperature.

By increasing the duration of the "ON" time of the pulses provided to IGBT 121, the system 101 raises the voltage of the Phase A winding terminal, with the greatest amount of ON time occurring at the maximum sinusoidal voltage of the Phase A winding terminal. In addition, the duration of the ON time of the gate voltage provided to IGBT 123 is increased to lower the voltage of the Phase A winding terminal, where the maximum amount of ON time is at the lowest value of the sinusoidal voltage at the Phase A winding terminal.

In some embodiments, the system 101 provides pulses to both IGBTs 121 and 123 during the peak and valley portions of a sinusoidal cycle. But in other embodiments, the system 101 supplies pulses to IGBT 121 only during the high portion of the sinusoid cycle, and supplies pulses to IGBT 123 only during the low portions of the sinusoidal cycle. In some embodiments, the system 101 can turn the IGBT continuously ON during some modes.

As shown, the IGBTs 121 and 123 and driver modules 105 and 107 are used to provide a regulated voltage to the phase A windings of the motor from power provided by a battery pack (not shown) at a supply voltage HV BATT. Though not shown, the system 101 may also control one or more additional sets of IGBTs (similar to IGBTs 121 and 123) and module pairs (similar to modules 105 and 107) for controlling the voltages to the other two-phase windings of the motor. The low voltage die of these other modules are also supplied with PWM signals from microcontroller 103. In some embodiments, system 101 includes a backup microcontroller coupled to the driver modules in case microcontroller 103 fails.

In selected embodiments, the three phases of the motor (not shown) are connected in a Y configuration. The corresponding PWM signals provided to the other two sets are out of phase with PWM1 and PWM2 by 120 degrees. In such embodiments, the resultant voltages provided to the three windings simulate (with some degree of error) three sinusoidal voltages that are 120 degrees out of phase with each other at the desired frequency.

In other embodiments, a motor controller may work in other ways or include other circuitry. Also, in other embodiments, system 101 may be used in other applications, such as for controlling different phase motors or for regulating voltages in a switching power supply. In some embodiments, system 101 can be used to regulate the voltage supplied to a traction motor to propel a vehicle. In other embodiments, system 101 can be used to boost the voltage of a battery pack such as with a switching power supply. System 101 can also be used in an inverter to convert power from DC to AC. In other embodiments, other types of power switches (e.g., power MOSFETs) can be used in place of the IGBTs.

Figure 2:
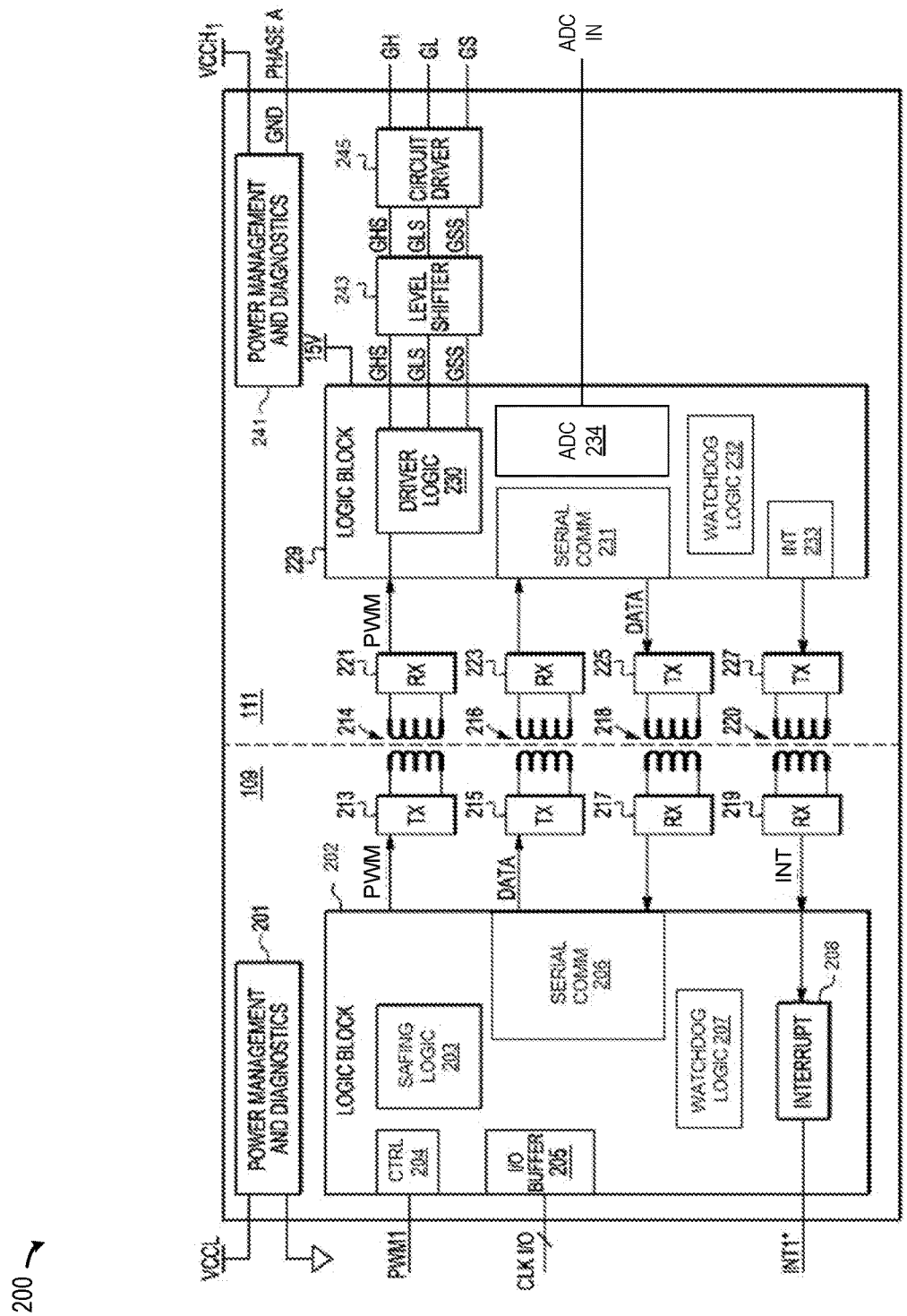
FIG. 2 depicts a circuit diagram of a driver module in accordance with selected embodiments of the present disclosure.

To provide additional details for an improved contextual understanding of the present disclosure, reference is now made to FIG. 2 which depicts a circuit diagram of a driver module 200 in accordance with selected embodiments of the present disclosure. In an example embodiment, the drive module 200 may be used to implement the driver module 105 shown in FIG. 1 to include a low voltage die 109 and a high voltage die 111 integrated in the same integrated circuit package.

As depicted, the low voltage die 109 may include power management module and diagnostics circuit 201 which receives the low supply voltage VCCL and provides regulated supply and reference voltages to the circuits of low voltage die 109 as well as includes circuitry for preforming diagnostics on the externally received supply voltage. The low voltage die 109 may also include logic block 202 which includes control logic 204 (for managing normal operations and for receiving and providing the PWM signals from microcontroller 103), safing logic 203 (for managing serious system level fault conditions, including MCU failure), I/O buffer 205 for receiving and providing signals (e.g., CLK and I/O signals) with the microcontroller 103, serial communications block 206 (for formatting data communications with the high voltage die 111), and interrupt logic 208 for receiving and providing interrupt signals (e.g., INT1*) with the microcontroller 103. In addition, the logic block 202 includes watchdog logic 207 for tracking the PWM signal characteristics (e.g., pulse width duration, duty cycle, frequency, signal transitions, etc.) and for scheduling the transmission of watchdog commands to control the timing of watchdog requests, data measurements, and watchdog responses in relation to PWM signal transitions in order to avoid periodic noise pulses generated at the high voltage die 111 in response to transitions in the PWM signal. Logic 202 may also include circuitry for performing various functions, including but not limited to configuration, deadtime control, cross conduction, fault management, communications, diagnostics (including built-in self-tests), and data manipulation.

As depicted, the high voltage die 111 may include power management module and diagnostics circuit 241 which receives a supply voltage (VCCH1) from regulator 120 and provides regulated supply and reference voltages to the circuits of high voltage die 111 as well as includes circuitry for preforming diagnostics on the externally received supply voltage. High voltage die 111 also includes a logic block 229 that includes driver logic 230 (for processing the received PWM signal to generate driving signals GHS, GLS, and GSS), serial communications block 231 (for receiving and providing data to low voltage die 109), and interrupt logic 233 for providing interrupt signals (e.g., INT) with the microcontroller 103. In addition, the logic block 229 includes watchdog logic 232 for tracking the PWM signal characteristics (e.g., pulse width duration, duty cycle, frequency, signal transitions, etc.) and for scheduling the transmission of watchdog commands to control the timing of watchdog requests, data measurements, and watchdog responses in relation to PWM signal transitions in order to avoid periodic noise pulses generated at the high voltage die 111 in response to transitions in the PWM signal. Logic block 229 may also include circuitry for performing various functions, including but not limited to monitoring circuitry, testing circuitry, calibration circuitry, and the like. For example, an analog-to-digital converter (ADC) block 234 may be provided and/or controlled at the high voltage die 111 to perform high voltage data operations in response to the watchdog commands.

As shown in FIG. 2, the low voltage die 109 may serve as the master device to initiate all communications with data requests, and the high voltage die 111 responds to the low voltage die 109 with data responses. To facilitate communications between the die 109, 111, the power module 105 includes four galvanic isolation barrier signal paths to permit the exchange of data between the die 109, 111, but to prevent the flow of current therebetween. A first signal path includes transmitting circuitry 213, transformer 214, and receiver circuitry 221 for transmitting the PWM signal from die 109 to die 111. A second signal path from the serial communication block 206 to the serial communication block 231 includes transmitting circuitry 215, transformer 216, and receiving circuitry 223 for transmitting data from die 109 to die 111. A third signal path from the serial communication block 231 to the serial communication block 206 includes transmitting circuitry 225, transformer 218, and receiving circuitry 217 for providing data from die 111 to die 109. And a fourth signal path includes transmitting circuitry 227, transformer 220, and receiving circuitry 219 for transmitting the interrupt signal from die 111 to die 109. Although the galvanic barrier isolation signal paths are implemented with transformers, in other embodiments, a galvanic barrier isolation signal path may be implemented with other types of devices, such as opto-isolators, capacitors, Hall Effect sensors, and magneto-couplers.

Thus connected, the die 109 provides the PWM signal to high voltage die 111 via the galvanic isolation barrier signal path of transmitting circuitry 213, transformer 214, and receiver circuitry 221. Driver logic 230 of logic block 229 receives the PWM signal and uses it to generate three driving signals (GHS, GLS, and GSS) which are provided to level shifters 243 which shift the voltage of the signals (e.g., from 1.5 Volts to 5 volts or from GND to GSS which in some cases can be set to a voltage below ground). The three signals are then provided to gate driver circuit 245. Gate driver circuit produces drive signal GH which is provided to resistor 131 (FIG. 1), produces drive signal GL which is provided to resistor 133 (FIG. 1), and produces drive signal GS which is provided directly to the control terminal of IGBT 121 (FIG. 1). These three signals are combined at the gate node to form the gate drive signal (GDS1) for controlling the conductivity of IGBT 121.

In this arrangement of signal paths, PWM input is transferred from the microprocessor/low voltage die 109 over the first signal path 213/214/221 to the high voltage die 111 to drive the power switch gate via the circuit driver 245 (GH/GL/GS pins). Likewise, the second and third signal paths provide a dedicated data link to configure the high voltage die 111 (with data requests over the second signal path) and to read back data from the high voltage die 111 (with data responses over the third signal path).

As disclosed herein, the transmission timing of watchdog commands between the low voltage die 109 and high voltage die 111 is controlled by the driver module 200 by using the watchdog logic 207, alone or in combination with the watchdog logic 232, to evaluate the incoming PWM1 signal, to predict when the PWM signal will be idle, and to schedule watchdog commands at the time(s) when the PWM signal is idle. For example, the watchdog logic 207 may evaluate the duty cycle of the previous PWM cycle to identify the longer idle time in the pulse and schedule the watchdog command to occur during the longer idle time. And if the frequency of the PWM signal is so fast that an entire watchdog command cannot be scheduled in the PWM pulse without conflicting with a PWM edge, then the watchdog logic 207 and/or watchdog logic 232 will delay the sending of a watchdog data response until another PWM cycle has occurred. In this way, the distorting noise effects from large periodic noise pulses generated by the PWM signal may be avoided or minimized, provided that the PWM frequency and duty cycle will not change significantly much from cycle-to-cycle. In addition to scheduling the watchdog commands so that data requests and responses can be generated away from signal transitions in the PWM signal, the watchdog logic 207, alone or in combination with the watchdog logic 232, can set a maximum waiting period between watchdog commands so that a watchdog data requests are issued on a predetermined schedule (e.g., every 200 μsec), even when there is no PWM signal provided to the high voltage die 111. In addition, the watchdog logic 207, alone or in combination with the watchdog logic 232, can monitor incoming PWM pulses and automatically retry the watchdog command a limited number of times upon detecting conflicts between PWM signal transitions and scheduled watchdog data responses from the high voltage die 111. And to prevent the system 200 from sending too many watchdog commands, the watchdog logic 207 may be configured to wait for at minimum specified wait time (e.g., at least 100 μsec) before scheduling another watchdog command.

Figure 3:
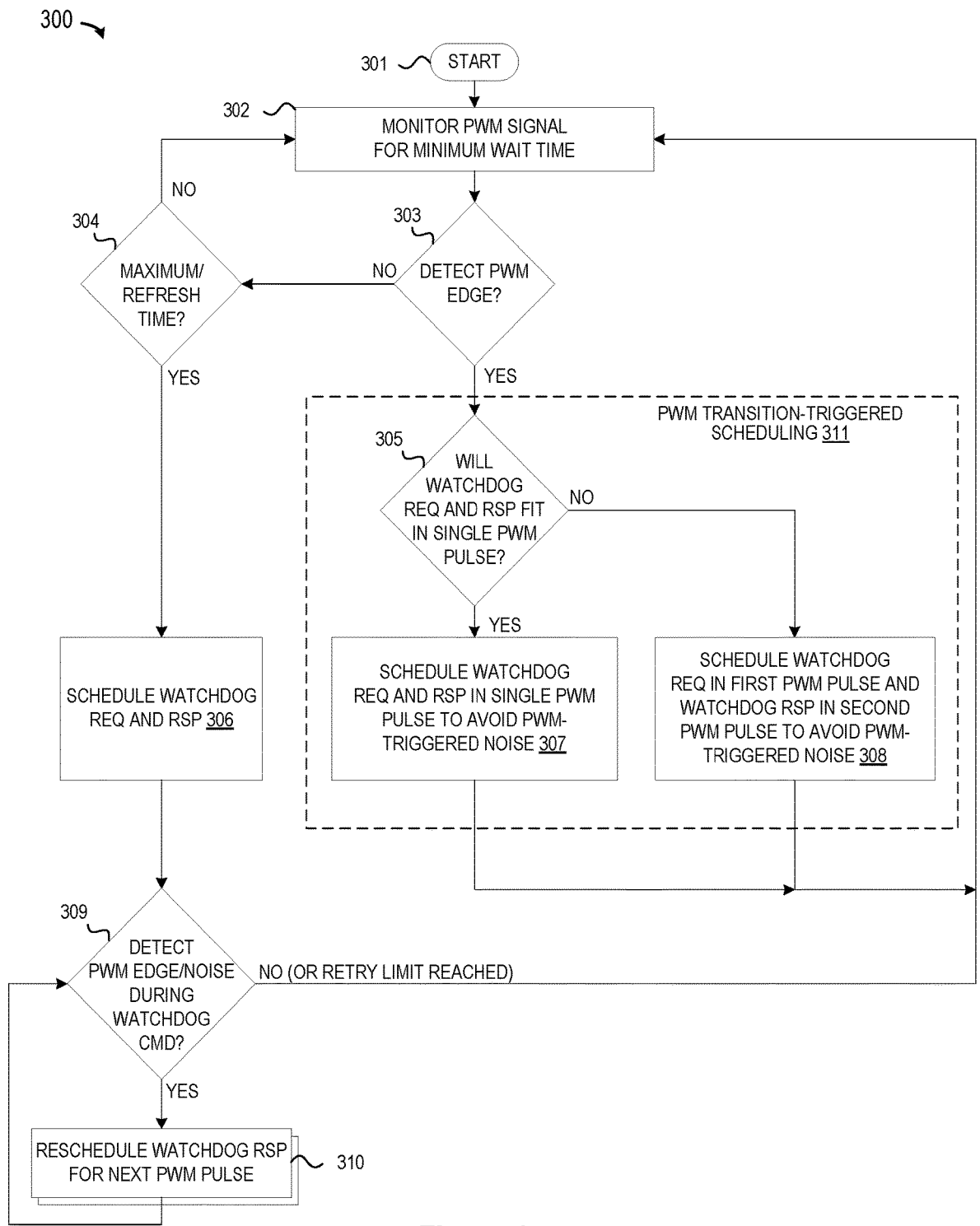
FIG. 3 depicts a simplified flow chart showing the logic for transmitting watchdog and precision measurements across a galvanic isolation barrier in the presence of large periodic noise pulses in accordance with selected embodiments of the present disclosure.

Referring now to FIG. 3, there is depicted an example flow chart diagram 300 of the logic for transmitting watchdog and precision measurements across a galvanic isolation barrier in the presence of large periodic noise pulses in accordance with selected embodiments of the present disclosure. In the flow diagram 300, the method steps may be performed by programmable software, hardware and/or firmware in the gate driver device (e.g., 105), alone or in combination with the microcontroller (e.g., 103), by using watchdog control logic (e.g., at the low voltage die 109) which is executed by a microprocessing subsystem to take advantage of its awareness of the state of an input PWM signal to determine when PWM signal transitions occur that correspond to noise pulses in the high voltage die. Using the PWM signal transition timing information, the gate driver device can then manage its communication between high and low voltage sides to avoid doing so when large noise is present that can corrupt a data frame. The disclosed methods provide a fast, accurate, safe, and power efficient mechanism for controlling the operation of a power device which is robust to the presence of large periodic noise pulses generated by the power device.

As a preliminary step 301, the gate driver device powers up both the low voltage and high voltage sides until their supplies are stable and regular communications commence. In an example embodiment where the gate driver device is used to control a three-phase motor drive by supplying PWM signals, low-to-high transitions of the PWM signal could generate noise on the high voltage die which could cause communication errors for data requests sent from the low voltage die to the high voltage die. In addition, this noise could also affect data response sent from the high voltage die to the low voltage die, and could even interfere with data measurement operations (e.g., analog-to-digital computations) at the high voltage die. Since the environment is very noisy, the gate driver device should not log a latched fault too easily. Faults should be latched only when it is very clearly needed. While digital filtering and configurable communication error counter techniques can be used to correctly identify a threshold number of specified errors before latching a fault and issuing an interrupt to the microcontroller, the gate driver device may also employ watchdog logic for scheduling and retrying the watchdog communications to avoid PWM edges (and resulting noise events).

To acquire timing information about the PWM edges and resulting noise events, the gate driver device monitors the PWM signal for a minimum wait time (e.g., 100 μsec) at step 302 to determine PWM signal characteristic information, such as pulse width duration, duty cycle, frequency, signal transitions duty cycle. The minimum wait time for monitoring the PWM signal prevents the gate driver device from consuming excessive resources by sending too many watchdog commands, for example in the case that the PWM period is much shorter than the refresh time required by the system. At step 302, the PWM signal is monitored over time to detect signal transitions and frequency and thereby predict when the PWM signal will be idle. For example, the watchdog logic may evaluate the previous PWM cycle to identify the longer idle time in the pulse and/or to detect if the frequency of the PWM signal is too fast for an entire watchdog command to be scheduled in the PWM pulse without conflicting with a PWM edge.

At step 303, the gate driver device determines if any PWM signal transitions or "edges" have been detected. If a PWM edge is not detected during the monitor/wait time (negative outcome to detection step 303), this may indicate that the device is in power-up mode before PWM signal activity has begun, or that there is simply no PWM activity for some other reason. In either case, the absence of PWM signals indicates that the environment is relatively noise free, but there should still be a baseline level of monitoring (even in the absence of PWM-triggered noise) by configuring the gate driver device to periodically issue watchdog commands to the high voltage die at a regular or specified refresh rate.

To provide baseline monitoring, the gate driver device determines if a maximum or refresh time interval has expired (e.g., Trefresh_min) at step 304. If the refresh timer has not expired (negative outcome to detection step 304), then the gate driver device continues monitoring the PWM signal (step 302). However, when the refresh time interval has been reached (affirmative outcome to detection step 304), then the gate driver device schedules a watchdog command at step 306 for exchanging messages between the low voltage die and high voltage die. In selected embodiments, the watchdog commands scheduled at step 306 (and steps 307 and 308 described hereinbelow) may use an encoding scheme, such as Manchester encoding, which does not require an additional clock. For example, a watchdog data request may be issued as a data frame having a predetermined number of bits (e.g., 24 bits) for specifying an address, data and possibly a CRC. For embodiments where bit times are on the order of 240 nsec, the resulting duration of the data frame would be approximately 6 µsec. Continuing with this example, a minimum "refresh rate" could be established by using a Trefresh_min of 200 usec, thereby insuring that a bad communication link is detected well before any damage or harm to the system can occur. Typically, the PWM period is shorter than the Trefresh_min.

To account for situations where a PWM signal transition or "edge" is detected that interferes with the scheduled watchdog command, the gate driver device may automatically reschedule the watchdog command a limited number of times before latching a fault condition. In selected embodiments, this retry procedure may be implemented with watchdog logic at the low voltage die and/or high voltage die which detects PWM edges or noise at step 309 that coincide with a scheduled watchdog command, such as a data request, data measurement, or data response. For example, an affirmative outcome to detection step 309 may indicate that the gate driver device detects a first PWM edge which occurs when a LV-HV data frame is being sent to request data from the high voltage die. If so, the gate driver device may automatically reschedule the watchdog data command at step 310 so that at least the data request in the LV-HV data frame is rescheduled for the next PWM pulse. Alternatively, an affirmative outcome to detection step 309 may indicate that the gate driver device has detected that a PWM edge occurs when a HV-LV data frame is being sent to provide a data response from the high voltage die. If so, the gate driver device may automatically reschedule the watchdog data command at step 310 so that the data response in the HV-LV data frame is rescheduled for the next PWM pulse. By limiting the number of reschedule operations at step 310 to a capped number (e.g., 2), the gate driver device may be configured to only increment the communication error counter if the capped number of retries is exceeded, indicating the data frame is corrupted by excessive PWM edge conflicts.

Referring back to step 303, PWM signal activity will be detected (affirmative outcome to detection step 303) as PWM activity commences, at which time the gate driver device schedules the watchdog communication frame timing at step 311 based on PWM transition triggering to be temporally separated from the noise activity in the high voltage die that is generated in response to the PWM signal transitions that can be either rising or falling transitions. Depending upon the frequency, duty cycle, and/or pulse width characteristics of the PWM signal, the scheduling step 311 should use the detected PWM signal transition timing to control transmission timing of the watchdog command data frames to avoid PWM-generated noise at the high voltage die. At a minimum, the scheduling step 311 will schedule the low voltage die to initiate or transmit a data request communication frame at a specified delay time AFTER each rising edge of the PWM. This delay time is set so that PWM-induced noise at the high voltage die is complete before starting the data request data frame.

In addition to accounting for rising transitions, the scheduling step 311 should account for falling transitions in the PWM signal which can also induce noise onto the high voltage die. For example, a short PWM pulse may have a falling edge that occurs during a data frame, in which case the gate driver device may retry the frame transmission. In selected embodiments, the scheduling step 311 may include one or more sub-steps for scheduling the timing of the watchdog requests and responses (and any required data processing) to avoid the PWM-generated noise at the high voltage die. For example, the gate driver device may first evaluate the PWM characteristics to determine if a watchdog request and response will both fit within a single PWM pulse (step 305). If so (affirmative outcome to detection step 305), then the watchdog request and response are both scheduled within a single PWM pulse to avoid PWM triggered noise (step 307). However, if the watchdog request and response will not both fit within a single PWM pulse (negative outcome to detection step 305), then the watchdog request and response are separately scheduled during first and second PWM pulses to avoid PWM triggered noise (step 308).

Upon conclusion of the PWM transition-triggered scheduling step 311, the process returns to monitor the PWM signal (step 302), and the sequence repeats. In addition or in the alternative, the gate driver device may continuously monitor the PWM signal edges and/or other noise sources that conflict with the watchdog commands, such as by proceeding to step 309 (not shown). As described hereinabove with respect to step 309, the gate driver device can monitor at least the PWM signal that drives the inverter branch of the high voltage motor (and possibly the other branch in the same phase), thereby tracking changes in the PWM signal that will occur during operation of the motor. However, in cases where the gate drive device only has access to the PWM signal for its own inverter branch but not for the other two phases, the detection step 309 may also detect noise induction from an alternate phase. Thus, any conflict detected at step 309 will cause a specified number of retry frames to be scheduled at step 310, and if a retry frame fails, the communication error counter may be incremented until the counter exceeds a predetermined amount, at which time a valid communication error will be latched to alert and/or interrupt the microprocessor. In selected embodiments, each subsequent retry frame may be scheduled to use a larger time delay the next time a retry frame is attempted in order to increase the likelihood of avoiding the particular noise signal causing the failed communication. In the absence of any conflicts (negative outcome to detection step 309), the process cycles back to continue monitoring the PWM signal (step 302).

Figure 4:
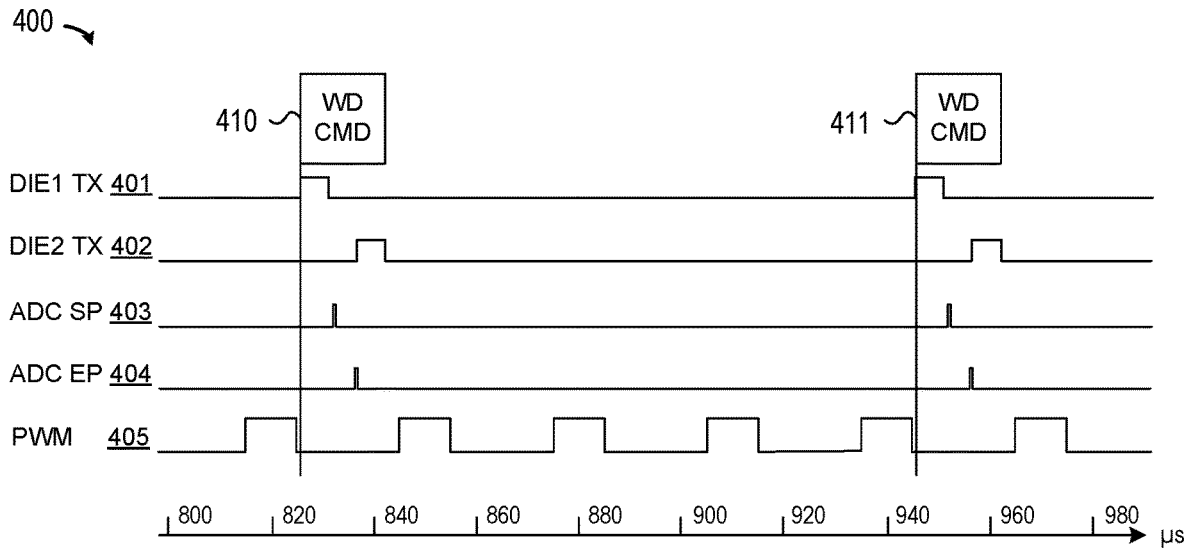
FIG. 4 depicts a first timing diagram for transmitting watchdog and precision measurements across a galvanic isolation barrier during a single PWM window in the presence of large periodic noise pulses in accordance with selected embodiments of the present disclosure.

To provide additional details for an improved contextual understanding of the present disclosure, reference is now made to FIG. 4 which depicts a first timing diagram 400 for transmitting watchdog and precision measurements across a galvanic isolation barrier during a single PWM window in the presence of large periodic noise pulses. In the depicted timing diagram, a first PWM signal 405 is shown which has a 33 kHz frequency and a relatively small duty cycle (e.g., DC<50%). To schedule the watchdog commands 410, 411 so that they avoid noise on the high voltage device that is caused by transitions (e.g., falling transitions) in the PWM signal 405, the watchdog logic waits for a predetermined delay time after a trailing edge of the PWM signal 405 before scheduling the watchdog command 410. For example, the watchdog command 410 may include: (1) a data request frame transmitted by the low voltage die (Die 1) to the high voltage die (Die 2), (2) a data operation, such as an analog-to-digital conversion performed at the high voltage die, and (3) a data response frame transmitted by the high voltage die (Die 2) to the low voltage die (Die 1).

In the first timing diagram 400, the DIE1 TX signal 401 shows that the timing of the data request frame transmitted by the low voltage die (Die 1) to the high voltage die (Die 2) is delayed by the predetermined delay time after a trailing edge of the PWM signal 405 to allow for noise dissipation during the low time of the PWM pulse. In addition, the remainder of the watchdog command 410 is also shown as being scheduled during the low time of the same PWM pulse 405 so that the timing of the data response frame is also completed in the same PWM pulse. In particular, the DIE2 TX signal 402 shows that the timing of the data response frame transmitted by the high voltage die (Die 2) to the low voltage die (Die 1) also occurs during the same PWM pulse so as to precede the rising edge of the PWM signal 405 to thereby avoid PWM-induced noise. To the extent there is any data processing required to perform the watchdog command 410 (such as analog-to-digital processing of temperature measurements), then the timing of these data processing operations is also scheduled to occur during the same PWM pulse. For example, the ADC SP signal 403 shows the Analog-to-Digital Converter Start Pulse (ADC SP) signal timing occurs in the low time of the same PWM pulse, while the ADC EP signal 404 shows an Analog-to-Digital Converter End Pulse (ADC EP) signal timing that also occurs in the low time of the same PWM pulse. While the watchdog command processing could be performed at every PWM cycle, this would consume system resources without providing significant improvements in operations, so the scheduling of subsequent watchdog commands (e.g., 411) may be delayed for a minimum wait time (e.g., at least 100 μsec) so that the next watchdog command 411 is transmitted after the predetermined delay from the next trailing edge of the PWM signal 405.

Figure 5:
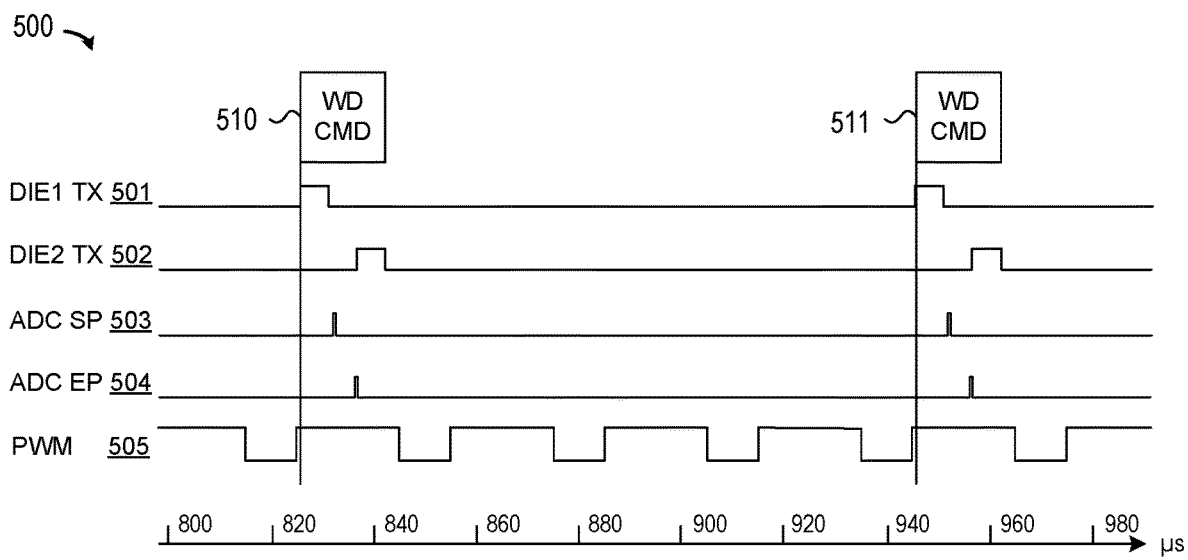
FIG. 5 depicts a second timing diagram for transmitting watchdog and precision measurements across a galvanic isolation barrier during a single PWM window in the presence of large periodic noise pulses in accordance with selected embodiments of the present disclosure

Since the galvanic isolation barrier benefits can also be achieved by scheduling the watchdog commands during the high time of the PWM signals, reference is now made to FIG. 5 which depicts a second timing diagram 500 for transmitting watchdog and precision measurements during high time phases of a single PWM window in the presence of large periodic noise pulses. In the depicted timing diagram, a second PWM signal 505 is shown which has a 33 kHz frequency and a relatively large duty cycle (e.g., DC>50%). To schedule the watchdog commands 510, 511 so that they avoid noise on the high voltage device that is caused by rising transitions the PWM signal 505, the watchdog logic waits for a predetermined delay time after a rising edge of the PWM signal 505 before scheduling the watchdog command 510 to occur during the high time of a single PWM pulse 505, as shown with the DIE1 TX signal 501 for the data request frame transmitted by the low voltage die (Die 1) to the high voltage die (Die 2) and the DIE2 TX signal 502 for the data response frame transmitted by the high voltage die (Die 2) to the low voltage die (Die 1). As shown, both the data request and data response frames occur during the high time of a single PWM pulse, thereby avoid PWM-induced noise from the rising and falling transitions in the PWM signal 505. To the extent there is any data processing required to perform the watchdog command 510, then the timing of these data processing operations is also scheduled to occur during the same PWM pulse. For example, the ADC SP signal 503 shows the signal timing occurs in the high time of the same PWM pulse, while the ADC EP signal 504 shows the signal timing that also occurs in the high time of the same PWM pulse. And while watchdog command processing could be performed at every PWM cycle, the scheduling of subsequent watchdog commands (e.g., 511) may be delayed for a minimum wait time (e.g., at least 100 μsec) to avoid excessive communications and related use of system resources. The logic may still process the PWM activity during this 100 usec wait time, allowing it to optimize the best edge to send a WD command after the timer expires.

Figure 6:
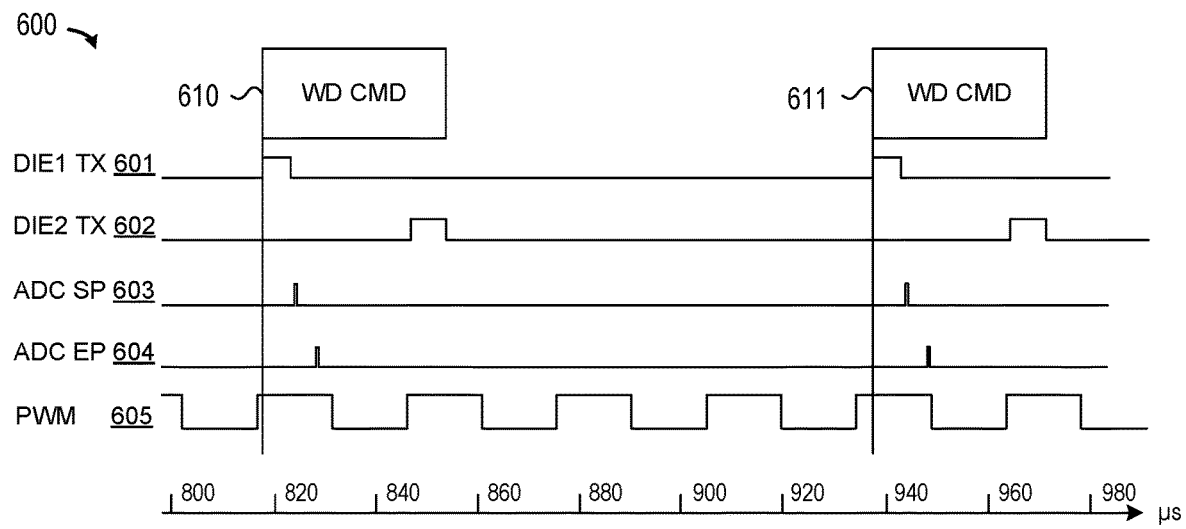
FIG. 6 depicts a third timing diagram for transmitting watchdog and precision measurements across a galvanic isolation barrier during at least two PWM windows in the presence of large periodic noise pulses in accordance with selected embodiments of the present disclosure.

As will be appreciated, the signal characteristics of the PWM signal (e.g., duty cycle, pulse width length and/or signal frequency) may not allow an entire watchdog command to be scheduled within a single PWM cycle, in which case one or more additional PWM cycles may be required to schedule the watchdog command. For example, reference is now made to FIG. 6 which depicts a third timing diagram 600 for transmitting watchdog and precision measurements during at least two PWM windows in the presence of large periodic noise pulses. In the depicted timing diagram, a third PWM signal 605 is shown which has a 35 kHz frequency and a duty cycle (e.g., DC>50%) which is not sufficient to allow scheduling of an entire watchdog command in a single PWM cycle. As will be appreciated, the frequency of the PWM signal can vary over a wide range of values (e.g., 10 kHz-40 kHz), though faster or slower PWM frequencies can be used, depending on the speed of the data channel and time it takes for data processing. In this case, the watchdog commands 610, 611 may each be scheduled across two successive PWM cycles to avoid noise on the high voltage device that is caused by signal transitions in the PWM signal 605. In particular, the watchdog logic may be configured to wait for a predetermined delay time after a first rising edge of the PWM signal 605 before scheduling the data request frame of the watchdog command 610 to occur, as shown with the DIE1 TX signal 601. However, if the data response frame cannot be immediately scheduled for transmission due to a conflict with the falling edge of the PWM signal 605, the watchdog logic may be configured to wait for a predetermined delay time after a rising edge of the next PWM signal 605 before scheduling the data response frame of the watchdog command 610 to occur, as shown with the DIE2 TX signal 602. As a result, the data request and data response frames for the first watchdog command 610 are scheduled to occur during the high time of a successive PWM pulses, thereby avoid PWM-induced noise from the rising and falling transitions in the PWM signal 605. In addition, any data processing required to perform the watchdog command 610 may have their timing scheduled to occur either during the high time of the first PWM pulse (as shown with the ADC SP signal 603 and ADC EP signal 604) or during the low time of the first PWM pulse (if desired). And even when the cyclic PWM signal continues to have signal transitions or edges that can be used to schedule additional watchdog commands, processing resources may be conserved by scheduling subsequent watchdog commands (e.g., 611) to be delayed for a minimum wait time (e.g., at least 100 µsec).

Figure 7:
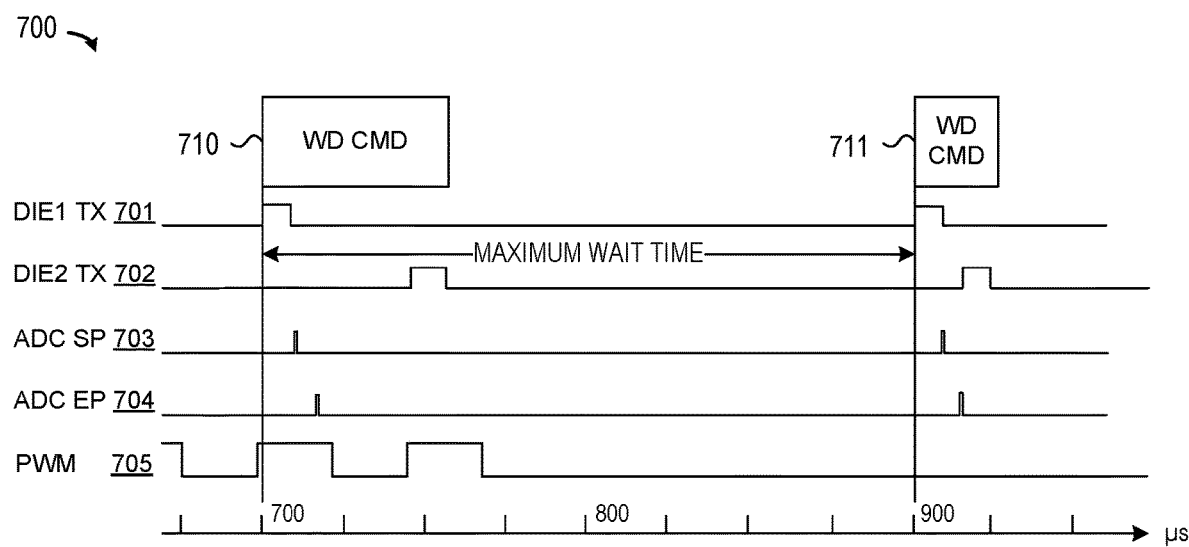
FIG. 7 depicts a fourth timing diagram for transmitting watchdog and precision measurements after a maximum wait time occurs without large periodic noise pulses occurring in accordance with selected embodiments of the present disclosure.

To address situations where the PWM signal transitions are not continuously cyclical, reference is now made to FIG. 7 which depicts a fourth timing diagram for transmitting watchdog and precision measurements after a maximum wait time occurs without an incoming PWM edge. In the depicted timing diagram 700, a fourth PWM signal 705 is shown which starts with a set frequency and duty cycle, but which then stops at some arbitrary point after the first watchdog command 710 is processed. In this example, the first watchdog command 710 is processed over successive PWM cycles to avoid noise on the high voltage device that is caused by signal transitions in the PWM signal 705, with the data request frame of the watchdog command 710 scheduled to occur after a predetermined delay from a first rising edge of the PWM signal 705 (as shown with the DIE1 TX signal 701), with any required data processing scheduled to occur between signal transitions in the first PWM pulse (as shown with the ADC SP signal 703 and ADC EP signal 704), and with the data response frame scheduled to occur after a predetermined delay from a rising edge of the next PWM signal 705 (as shown with the DIE2 TX signal 702). However, in the absence of additional PWM signal transitions being detected (as shown with right portion of PWM signal 705) and used to schedule the next watchdog command, the watchdog logic may be configured to wait for a maximum wait time (e.g., 200 µsec) in the absence of any detected PWM activity before scheduling the next watchdog command 711. In this case, there are no PWM signal transitions available to guide the scheduling, so the data request and data response frames for the second watchdog command 711 may be scheduled to occur on a predetermined scheduling basis since there is no need to avoid PWM-induced noise from rising and falling transitions in the PWM signal 705.

Figure 8:
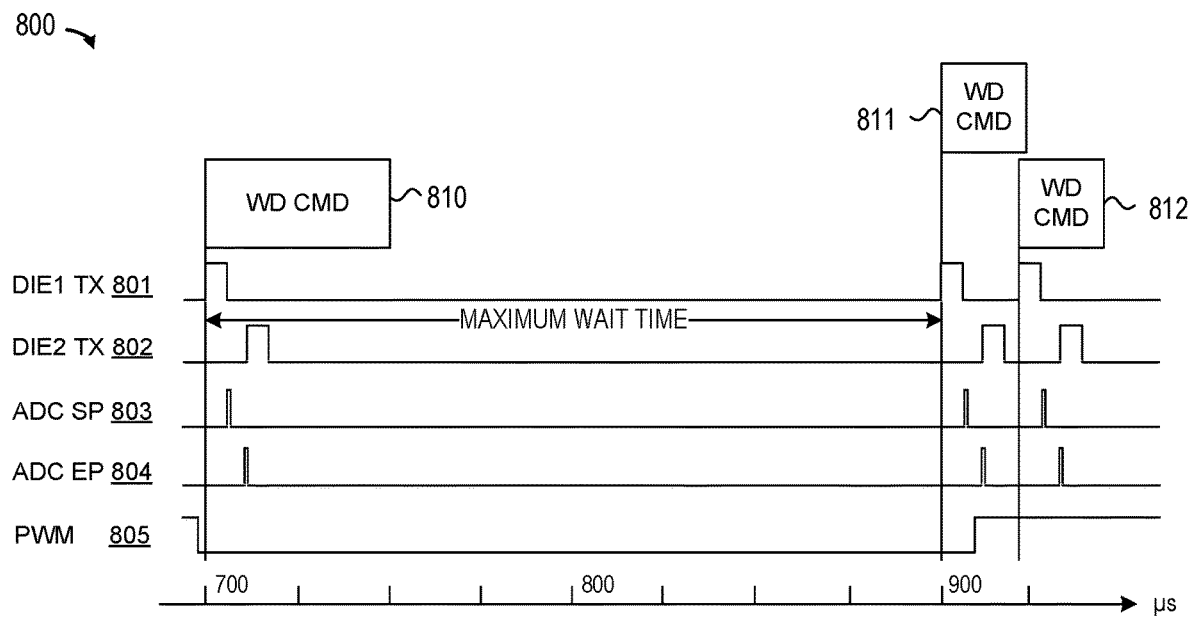
FIG. 8 depicts a fifth timing diagram for a single retransmission of watchdog and precision measurements across a galvanic isolation barrier when large periodic noise pulses occur during a first scheduled transmission of watchdog and precision measurements in accordance with selected embodiments of the present disclosure.

Of course, the unpredictable nature of PWM activity can also present situations where PWM signal transitions occur unexpectedly (at least on the basis of previously-monitored PWM signal behavior) and create conflicts with scheduled watchdog commands, in which case one or more retry attempts can be made to reschedule the watchdog command(s). To provide an illustrative example, reference is now made to FIG. 8 which depicts a fifth timing diagram 800 for a single retransmission of watchdog and precision measurements when large periodic noise pulses occur during a first scheduled transmission of watchdog and precision measurements. In the depicted timing diagram 800, a fifth PWM signal 805 illustrates that a first PWM pulse triggers the scheduling of a first watchdog command 810, and also shows that a second PWM pulse conflicts with the scheduled second watchdog command 811 which, in this case, is schedule by virtue of the maximum wait time expiring. In this example, the processing of the second watchdog command 811 starts, but the rising transition in the second PWM pulse 805 conflicts with the data processing scheduled to occur between the pulses in the ADC SP signal 803 and ADC EP signal 804. In the event of such a detected conflict, the watchdog logic is configured to immediately reschedule the watchdog command by controlling the timing of the third watchdog command 812 to occur after a set time delay after the second watchdog command 811 or after the conflicting transition in the PWM signal 805. In the illustrated timeline 800, there are no additional PWM signal transitions, and as a result, the third watchdog command 812 is successfully processed by scheduling the data request and data response frames to occur on a predetermined scheduling basis.

Figure 9:
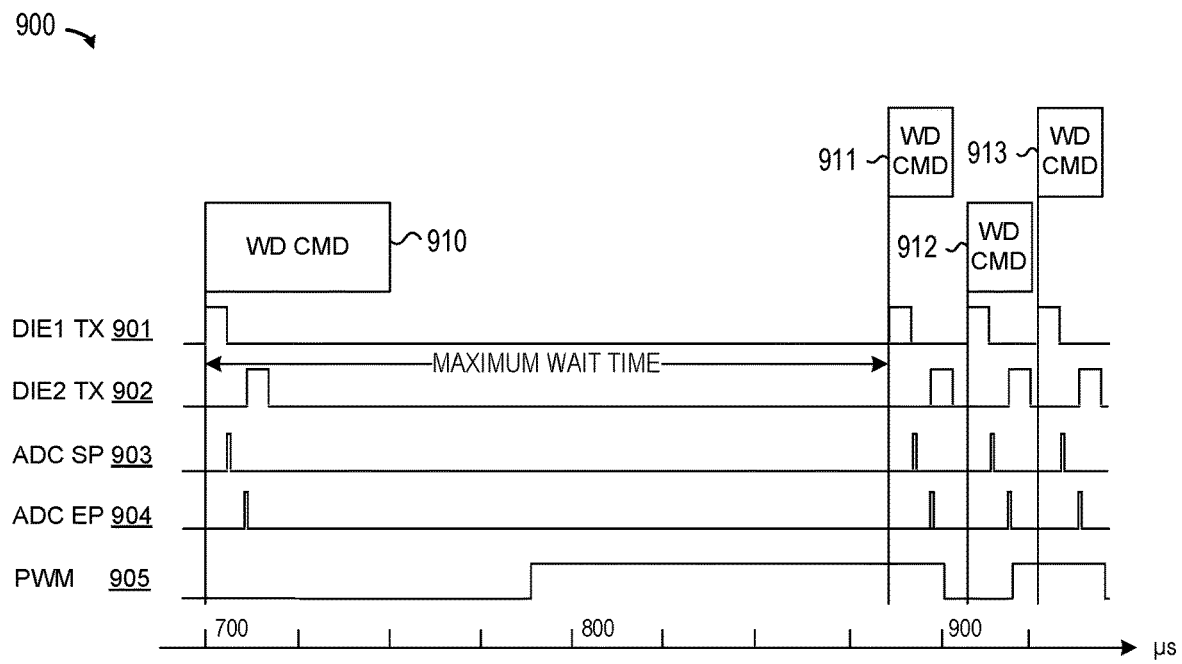
FIG. 9 depicts a sixth timing diagram for re-transmitting watchdog and precision measurements when large periodic noise pulses occur during scheduled transmission of watchdog and precision measurements in accordance with selected embodiments of the present disclosure.

To prevent the retry attempts from being repeated indefinitely in the event of additional PWM signal transition conflicts, the watchdog logic may impose a limit on the number of retry attempts. To provide an illustrative example, reference is now made to FIG. 9 which depicts a sixth timing diagram 900 for a limited number of watchdog retransmission attempts when large periodic noise pulses occur during multiple retry attempts. In the depicted timing diagram 900, a sixth PWM signal 905 illustrates that a first watchdog command 910 is scheduled on some unspecified basis, and also shows that the falling transition of the first PWM pulse conflicts with the scheduled second watchdog command 911 which, in this case, is schedule by virtue of the maximum wait time expiring. In this example, the processing of the second watchdog command 911 starts, but the falling transition in the first PWM pulse 905 conflicts with the data response frame shown in the Die2 TX signal 902. In response to the detected conflict with the falling transition of the PWM signal 905, the watchdog logic is configured to immediately reschedule the second watchdog command by scheduling the third watchdog command 912 as a first retry to occur on a predetermined basis (e.g., after a set time delay after the second watchdog command 911 or after the conflicting transition in the PWM signal 905). However, the timing diagram 900 shows that an additional PWM signal conflict occurs when the rising transition of a second PWM pulse 905 conflicts with the data response frame of the third watchdog command 912 shown in the Die2 TX signal 902. In response to the detected conflict, the watchdog logic is configured to make one final retry attempt to reschedule the watchdog command by controlling the timing of the fourth watchdog command 913 as a second or final retry to occur on a predetermined basis. If the third watchdog command 913 is successfully processed without conflict by the PWM signal 905, then the gate driver device returns to normal operation. But if there is another conflict with the PWM signal, then a communication error counter may be incremented to indicate a data packet failure, and any required fault processing is performed, or if that last retry command is successfully sent and returned, then the logic can accept it as a valid command and avoid incrementing the communication error counter. By limiting the number of watchdog command transmission attempts to a maximum number (e.g., two retries), the watchdog logic prevents the gate driver device from getting into an endless retry mode.

By now it should be appreciated that there has been provided a control system, apparatus, method, and program code for transmitting watchdog and precision measurements across a galvanic isolation barrier in the presence of large periodic noise pulses. In the disclosed embodiments, a first voltage domain circuit and a power switch operate in a first voltage domain. In addition, a second voltage domain circuit includes circuitry for operating in a second voltage domain. In particular, the second voltage domain circuit includes a gate driver circuit for providing a control terminal driving signal to drive the power switch, the control terminal driving signal is characterized as a pulse width modulated signal. The second voltage domain circuit also includes a watchdog communication circuit for scheduling watchdog communications between the first and second voltage domain circuits to be temporally separated from noise-inducing signal transitions in the control terminal driving signal. The control system may also include a galvanic isolation barrier signal path between the first voltage domain circuit and the second voltage domain circuit, wherein the control terminal driving signal is provided by the second voltage domain circuit to the first voltage domain circuit via the galvanic isolation barrier signal path. In addition, the watchdog communications may be exchanged between the first voltage domain circuit and the second voltage domain circuit via a galvanic isolation barrier signal path. In operation, the watchdog communication circuit evaluates the PWM signal based on pulse width duration, duty cycle, frequency, and/or signal transition metrics of the PWM signal to schedule watchdog communications so that data operation requests, data operations, and data operation responses are timed to avoid noise events in the first voltage domain circuit caused by transitions in the PWM signal. In selected embodiments, the watchdog communication circuit schedules watchdog communications to process a watchdog command within a single pulse of the PWM signal. In other embodiments, the watchdog communication circuit schedules watchdog communications by transmitting a data request from the second voltage domain circuit to the first voltage domain circuit in a first pulse of the PWM signal, and by transmitting a data response from the first voltage domain circuit to the second voltage domain circuit in a second pulse of the PWM signal. In addition, the watchdog communication circuit may be configured to schedule watchdog communications by waiting a minimum and/or maximum waiting time between processing watchdog commands. In other embodiments, the watchdog communication circuit may be configured to schedule watchdog communications by automatically rescheduling a first watchdog command up to a specified limit of retries if processing of the first watchdog command conflicts with a noise-inducing signal transition in the control terminal driving signal.

In another form, there is provided a control system, apparatus, method, and program code for operating a power switch. In the disclosed embodiments, a first voltage domain circuit provides a control terminal driving signal (e.g., pulse width modulated (PWM) signal) to a control terminal of a power switch in a second voltage domain to control the conductivity of the power switch. In addition, the first voltage domain circuit schedules watchdog communications between the first and second voltage domain circuits to avoid noisy circuit operations in the second voltage domain circuit that are induced by transitions in the control terminal driving signal. In selected embodiments, the watchdog communications in the first voltage domain circuit schedules data operation requests, data operations, and/or data operation responses associated with the watchdog communications via a galvanic isolation barrier signal path between the first voltage domain circuit and the second voltage domain circuit to be temporally separated from noise-inducing signal transitions in the control terminal driving signal. In other embodiments, the watchdog communications are scheduled by evaluating the PWM signal based on pulse width duration, duty cycle, frequency, and/or signal transition metrics of the PWM signal to schedule watchdog communications so that data operation requests, data operations, and data operation responses are timed to avoid noise events in the second voltage domain circuit caused by transitions in the PWM signal. This scheduling may be done by scheduling a data operation request, data operation, and/or data operation response for a watchdog command within a single pulse of the PWM signal. Also, this scheduling may be done by transmitting a data operation request from the first voltage domain circuit to the second voltage domain circuit within a first pulse of the PWM signal and scheduling a data response from the second voltage domain circuit to the first voltage domain circuit in a second pulse of the PWM signal. In selected embodiments, the scheduling of watchdog communications includes waiting a minimum waiting time between processing watchdog commands.

In yet another form, there is provided a control system, apparatus, method, and program code for operating a power switch. In the disclosed control system, a high voltage die is connected to a power switch. In addition, low voltage die is provided that includes a driver circuit for providing a pulse width modulated (PWM) signal to drive the power switch. The low voltage die also includes a watchdog communication circuit for scheduling watchdog communications between the low voltage die and the high voltage die to avoid noisy circuit operations in the high voltage die that are induced by transitions in the PWM signal. The control system also includes a first galvanic isolation barrier signal path between the low voltage die and the high voltage die, where the low voltage die is operable to provide the PWM signal to the high voltage die via the first galvanic isolation barrier signal path. The control system also includes a second galvanic isolation barrier signal path between the low voltage die and the high voltage die, where the watchdog communications are exchanged between the low voltage die and the high voltage die via the second galvanic isolation barrier signal path. As a result of this control system configuration, the watchdog communication circuit is operable to schedule data operation requests, data operations, and data operation responses associated with each watchdog communication to be temporally separated from periodic signal transitions in the PWM signal. In selected embodiments, the watchdog communication circuit schedules data operation requests, data operations, and/or data operation responses for a watchdog command to occur within one or more pulses of the PWM signal to avoid noisy circuit operations in the high voltage die that are induced by transitions in the PWM signal. In other embodiments, the high voltage die includes an analog-to-digital circuit for converting analog signal information from the power switch. In such embodiments, the watchdog communication circuit controls activation of the analog-to-digital circuit to operate during a pulse of the PWM signal.

Although the described exemplary embodiments disclosed herein focus on power controllers for three-phase motors and methods for using same, the present invention is not necessarily limited to the example embodiments illustrate herein and may be applied to any power controller wherein input signal transitions induce noise in the high voltage domain. Thus, the particular embodiments disclosed above are illustrative only and should not be taken as limitations upon the present invention, as the invention may be modified and practiced in different but equivalent manners apparent to those skilled in the art having the benefit of the teachings herein. Accordingly, the foregoing description is not intended to limit the invention to the particular form set forth, but on the contrary, is intended to cover such alternatives, modifications and equivalents as may be included within the spirit and scope of the invention as defined by the appended claims so that those skilled in the art should understand that they can make various changes, substitutions and alterations without departing from the spirit and scope of the invention in its broadest form.

Benefits, other advantages, and solutions to problems have been described above with regard to specific embodiments. However, the benefits, advantages, solutions to problems, and any element(s) that may cause any benefit, advantage, or solution to occur or become more pronounced are not to be construed as a critical, required, or essential feature or element of any or all the claims. As used herein, the terms "comprises," "comprising," or any other variation thereof, are intended to cover a non-exclusive inclusion, such that a process, method, article, or apparatus that comprises a list of elements does not include only those elements but may include other elements not expressly listed or inherent to such process, method, article, or apparatus.

What is claimed is:

1. A control system comprising:
a first voltage domain circuit and a power switch operating in a first voltage domain; and
a second voltage domain circuit operating in a second voltage domain, the second voltage domain circuit comprising:
a gate driver circuit for providing a control terminal driving signal to drive the power switch; and
a watchdog communication circuit for scheduling watchdog communications between the first and second voltage domain circuits to be temporally separated from noise-inducing signal transitions in the control terminal driving signal.

2. The control system of claim 1, further comprising a galvanic isolation barrier signal path between the first voltage domain circuit and the second voltage domain circuit, wherein the control terminal driving signal is provided by the second voltage domain circuit to the first voltage domain circuit via the galvanic isolation barrier signal path.

3. The control system of claim 1, further comprising a galvanic isolation barrier signal path between the first voltage domain circuit and the second voltage domain circuit, wherein the watchdog communications are exchanged between the first voltage domain circuit and the second voltage domain circuit via the galvanic isolation barrier signal path.

4. The control system of claim 1, wherein during operation, the control terminal driving signal is characterized as a pulse width modulated (PWM) signal.

5. The control system of claim 4, where the watchdog communication circuit evaluates the PWM signal based on pulse width duration, duty cycle, frequency, and/or signal transition metrics of the PWM signal to schedule watchdog communications so that data operation requests, data operations, and data operation responses are timed to avoid noise events in the first voltage domain circuit caused by transitions in the PWM signal.

6. The control system of claim 4, where the watchdog communication circuit schedules watchdog communications to process a watchdog command within a single pulse of the PWM signal.

7. The control system of claim 4, where the watchdog communication circuit schedules watchdog communications by transmitting a data request from the second voltage domain circuit to the first voltage domain circuit in a first pulse of the PWM signal, and by transmitting a data response from the first voltage domain circuit to the second voltage domain circuit in a second pulse of the PWM signal.

8. The control system of claim 1, where the watchdog communication circuit schedules watchdog communications by waiting a minimum waiting time between processing watchdog commands.

9. The control system of claim 1, where the watchdog communication circuit schedules watchdog communications by waiting a maximum waiting time between processing watchdog commands.

10. The control system of claim 1, where the watchdog communication circuit schedules watchdog communications by automatically rescheduling a first watchdog command up to a specified limit of retries if processing of the first watchdog command conflicts with a noise-inducing signal transition in the control terminal driving signal.

11. A method of operating a power switch, the method comprising:
providing by a first voltage domain circuit a control terminal driving signal to a control terminal of a power switch in a second voltage domain to control the conductivity of the power switch; and
scheduling, by the first voltage domain circuit, watchdog communications between the first and second voltage domain circuits to avoid noisy circuit operations in the second voltage domain circuit that are induced by transitions in the control terminal driving signal.

12. The method of claim 11, where scheduling watchdog communications comprises scheduling, by the first voltage domain circuit, data operation requests, data operations, and/or data operation responses associated with the watchdog communications via a galvanic isolation barrier signal path between the first voltage domain circuit and the second voltage domain circuit to be temporally separated from noise-inducing signal transitions in the control terminal driving signal.

13. The method of claim 11, wherein the control terminal driving signal is a pulse width modulated (PWM) signal.

14. The method of claim 13, where scheduling watchdog communications comprises evaluating the PWM signal based on pulse width duration, duty cycle, frequency, and/or signal transition metrics of the PWM signal to schedule watchdog communications so that data operation requests, data operations, and data operation responses are timed to avoid noise events in the second voltage domain circuit caused by transitions in the PWM signal.

15. The method of claim 13, where scheduling watchdog communications comprises scheduling a data operation request, data operation, and/or data operation response for a watchdog command within a single pulse of the PWM signal.

16. The method of claim 13, where scheduling watchdog communications comprises transmitting a data operation request from the first voltage domain circuit to the second voltage domain circuit within a first pulse of the PWM signal and scheduling a data response from the second voltage domain circuit to the first voltage domain circuit in a second pulse of the PWM signal.

17. The method of claim 13, where scheduling watchdog communications comprises waiting a minimum waiting time between processing watchdog commands.

18. A control system comprising:
a high voltage die connected to a power switch;
a low voltage die comprising:
  a driver circuit for providing a pulse width modulated (PWM) signal to drive the power switch, and
  a watchdog communication circuit for scheduling watchdog communications between the low voltage die and high voltage die to avoid noisy circuit operations in the high voltage die that are induced by transitions in the PWM signal;
a first galvanic isolation barrier signal path between the low voltage die and the high voltage die, wherein the low voltage die is operable to provide the PWM signal to the high voltage die via the first galvanic isolation barrier signal path;
a second galvanic isolation barrier signal path between the low voltage die and the high voltage die, wherein the watchdog communications are exchanged between the low voltage die and the high voltage die via the second galvanic isolation barrier signal path;
  wherein watchdog communication circuit schedules data operation requests, data operations, and data operation responses associated with each watchdog communication to be temporally separated from periodic signal transitions in the PWM signal.

19. The control system of claim 18, where the watchdog communication circuit schedules data operation requests, data operations, and/or data operation responses for a watchdog command to occur within one or more pulses of the PWM signal to avoid noisy circuit operations in the high voltage die that are induced by transitions in the PWM signal.

20. The control system of claim 18, where the high voltage die comprises an analog-to-digital circuit for converting analog signal information from the power switch, and where the watchdog communication circuit controls activation of the analog-to-digital circuit to operate during a pulse of the PWM signal.

* * * * *